(12) United States Patent
Ferriss et al.

(10) Patent No.: US 10,727,847 B1
(45) Date of Patent: Jul. 28, 2020

(54) DIGITAL CONTROL OF A VOLTAGE CONTROLLED OSCILLATOR FREQUENCY

(71) Applicant: INTERNATIONAL BUSINESS MACHINES CORPORATION, Armonk, NY (US)

(72) Inventors: Mark Ferriss, Tarrytown, NY (US); Bodhisatwa Sadhu, Peekskill, NY (US); Wooram Lee, Briarcliff Manor, NY (US); Daniel Friedman, Sleepy Hollow, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/270,564

(22) Filed: Feb. 7, 2019

(51) Int. Cl.
*H03L 7/099* (2006.01)
*H03B 5/12* (2006.01)
*H03L 7/10* (2006.01)

(52) U.S. Cl.
CPC ........... *H03L 7/0991* (2013.01); *H03B 5/124* (2013.01); *H03B 5/1206* (2013.01); *H03B 5/1265* (2013.01); *H03L 7/102* (2013.01)

(58) Field of Classification Search
CPC combination set(s) only.
See application file for complete search history.

(56) References Cited

U.S. PATENT DOCUMENTS

| 4,577,163 A | 3/1986 | Culp |
| 5,426,384 A | 6/1995 | May et al. |
| 5,844,448 A | 12/1998 | Jackoski |
| 5,896,428 A | 4/1999 | Yanagiuchi |
| 5,945,856 A | 8/1999 | Yanagiuchi |
| 6,064,244 A | 5/2000 | Wakayama et al. |
| 6,815,996 B1 | 11/2004 | Hsiao |
| 7,064,622 B2 | 6/2006 | Jasa et al. |
| 7,084,713 B2 | 8/2006 | Peluso |
| 7,268,630 B2 | 9/2007 | Rhee et al. |
| 7,336,134 B1 | 2/2008 | Janesch et al. |
| 7,496,781 B2 | 2/2009 | Tamura et al. |
| 7,551,037 B2 | 6/2009 | Isobe et al. |
| 7,567,139 B2 | 7/2009 | Tsukizawa |
| 7,675,373 B2 | 3/2010 | Thaller |

(Continued)

OTHER PUBLICATIONS

List of IBM Patents or Applications Treated as Related.
(Continued)

*Primary Examiner* — Jeffrey M Shin
(74) *Attorney, Agent, or Firm* — Intelletek Law Group, PLLC; Gabriel Daniel, Esq.

(57) ABSTRACT

A capacitance of a digitally controlled circuit coupled to a first multiplexer (MUX) having a first switch coupled between a first input and a first output, a first pullup device coupled between VDD and the first output, and a first pulldown device coupled between the first output and VSS is controlled. For falling slope of the first output, in a first phase, which is before the falling slope of the first output, turning ON the first switch, and turning OFF the first pullup device. In a second phase, which is during the falling slope of the first output, the first input is coupled to an output of a digital to analog converter coupled to the MUX. In a third phase, which is after the falling slope of the first output, the first switch is turned OFF and the first pulldown device is turned ON.

20 Claims, 11 Drawing Sheets

(56) References Cited

U.S. PATENT DOCUMENTS

| | | |
|---|---|---|
| 7,711,340 B2 | 5/2010 | Kim et al. |
| 8,000,428 B2 | 8/2011 | Staszewski et al. |
| 8,154,351 B2 | 4/2012 | Tadjpour et al. |
| 8,217,690 B2 | 7/2012 | Hu et al. |
| 8,217,729 B2 | 7/2012 | Chern et al. |
| 8,299,862 B1 | 10/2012 | De Bernardinis et al. |
| 8,698,566 B2 | 4/2014 | Chern et al. |
| 8,766,689 B2 | 7/2014 | Wen |
| 8,884,693 B2 | 11/2014 | Lee |
| 9,070,510 B2 | 6/2015 | Ahmed et al. |
| 9,112,745 B2 | 8/2015 | Mikhemar et al. |
| 9,325,332 B2 * | 4/2016 | Ainspan .................. H03B 1/00 |
| 9,837,959 B2 | 12/2017 | Ainspan et al. |
| 9,954,486 B2 | 4/2018 | Ainspan et al. |
| 2006/0097772 A1 | 5/2006 | Sakiyama et al. |
| 2008/0012654 A1 | 1/2008 | Han et al. |
| 2008/0144252 A1 | 6/2008 | Abadeer et al. |
| 2008/0265998 A1 | 10/2008 | Wood |
| 2009/0085681 A1 | 4/2009 | Lin et al. |
| 2009/0251226 A1 | 10/2009 | Kathuria et al. |
| 2009/0284318 A1 | 11/2009 | Machado |
| 2009/0302958 A1 | 12/2009 | Sakurai et al. |
| 2010/0102894 A1 | 4/2010 | Sun et al. |
| 2010/0134163 A1 | 6/2010 | Kawamoto |
| 2011/0248787 A1 | 10/2011 | Jiang |
| 2011/0254602 A1 | 10/2011 | Steiner |
| 2012/0319734 A1 | 12/2012 | Nagaraj et al. |
| 2013/0076414 A1 | 3/2013 | Kato |
| 2013/0107978 A1 | 5/2013 | Thaller et al. |
| 2018/0191364 A1 | 7/2018 | Pavlovic |

OTHER PUBLICATIONS

Deng. W. et al., "A 0.0066mm2 780μW Fully Synthesizable PLL with a Current Output DAC and an Interpolative Phase-Coupled Oscillator using Edge Injection Technique"; IEEE International Solid-State Circuits Conference (2014); 43 pgs.

* cited by examiner

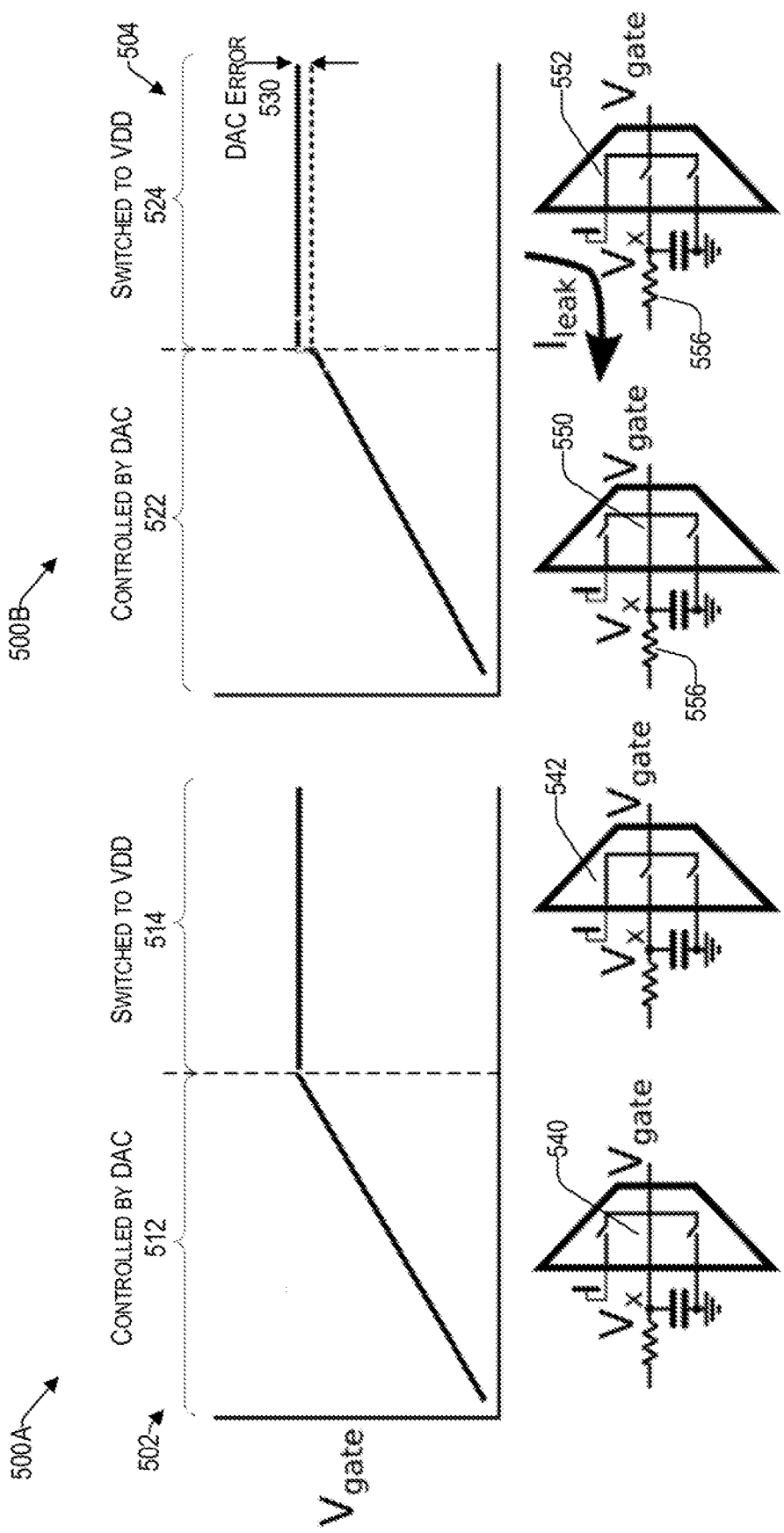

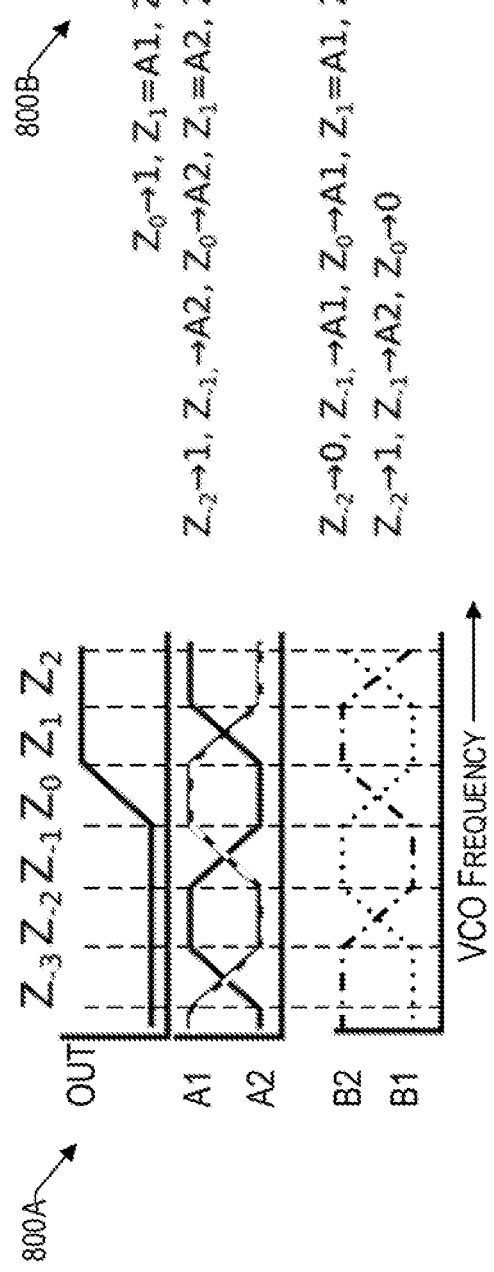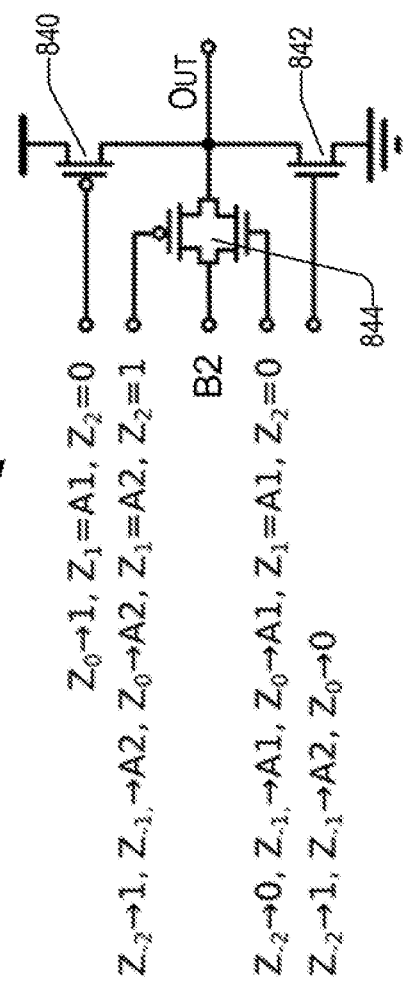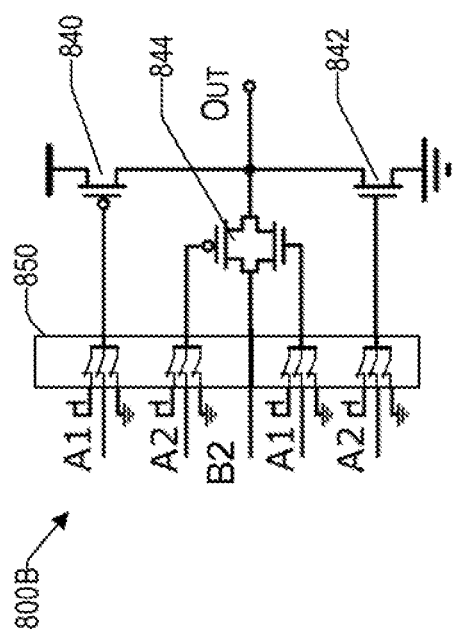

10,727,847 B1

DIGITAL CONTROL OF A VOLTAGE CONTROLLED OSCILLATOR FREQUENCY

STATEMENT REGARDING FEDERALLY SPONSORED RESEARCH OR DEVELOPMENT

This application has been written with Government support under Contract No.: FA865009C7924 (Defense Advanced Research Projects Agency (DARPA)). The Government has certain rights in this invention.

BACKGROUND

Technical Field

The present disclosure generally relates to oscillators, and more particularly, to systems and methods of controlling oscillator frequency.

Description of the Related Art

Oscillators are used in various circuits, integrated circuits (chips), and systems. Oscillators often include an inductor, a capacitor, a negative resistance element to maintain oscillation and a variable capacitor or varactor for controlling the frequency of the oscillator. An oscillator controlled with a digital control word is referred to as a digitally-controlled oscillator (DCO). An oscillator controlled with an analog control voltage is referred to as a voltage-controlled oscillator (VCO).

SUMMARY

According to an embodiment of the present disclosure, an apparatus is provided to control a capacitance of a digitally controlled circuit. There is a first multiplexer (MUX) coupled to the digitally controlled circuit. The first MUX includes a first switch coupled between a first input and a first output. A first pullup device is coupled between VDD and the first output. A first pulldown device is coupled between the first output and VSS. There is a digital to analog converter (DAC) coupled the MUX. A controller is configured to control a falling slope of the first output by in a first phase, which is before the falling slope of the first output, turning ON the first switch, and turning OFF the first pullup device. In a second phase, which is during the falling slope of the first output, the first input is coupled to an output of the DAC. In a third phase, which is after the falling slope of the first output, the first switch is turned OFF and the first pulldown device is turned ON.

In one embodiment, the controller is configured to control a rising slope of the first output by, in a first phase, which is before the rising slope of the first output, turning ON the first switch, and turning OFF the first pulldown device. In a second phase, which is during the rising slope of the first output, the first input is coupled to an output of the DAC. In a third phase, which is after the rising slope of the first output, the first switch is turned OFF and the first pulldown device is turned ON.

In one embodiment, there is a second MUX coupled to the digitally controlled circuit. The second MUX includes a second switch coupled between a second input and a second output. A second pullup device is coupled between VDD and the second output. A second pulldown device is coupled between the second output and VSS, wherein the controller is configured to control a rising slope of the second output by, in a first phase, which is before the rising slope of the second output, turning ON the second switch, and turning OFF the second pulldown device. In a second phase, which is during the rising slope of the second output, the second input is coupled to an output of the DAC. In a third phase, which is after the rising slope of the second output, the second switch is turned OFF and the second pullup device is turned ON.

In one embodiment, the first output is coupled to one or more gate nodes of the digitally controlled circuit to control the variable capacitance of the digitally controlled circuit and the second output is coupled to one or more bias nodes of the digitally controlled circuit to control the variable capacitance of the digitally controlled circuit.

In one embodiment, the controller is configured to control the first switch, the first pullup device, and the first pulldown device independently.

In one embodiment, the pullup device is a PFET and the pulldown device is an NFET.

In one embodiment, the digitally controlled circuit is a folding switched capacitor circuit.

In one embodiment, the multiplexer is an analog multiplexer. There may be an RC filter between the DAC and the analog multiplexer.

In one embodiment, the digitally controlled circuit includes a plurality of switched capacitor circuits. Each switched capacitor circuit includes a transistor having a gate node, a first node, and a second node, a first capacitor coupled to the first node of the transistor, a second capacitor coupled to the second node of the transistor, a first resistor coupled between the first node of the transistor and a bias node, and a second resistor coupled between the second node of the transistor and the bias node.

According to one embodiment of the present disclosure, an integrated circuit is provided that includes a digitally controlled circuit having a variable capacitance. There is a first multiplexer (MUX) coupled to the digitally controlled circuit. The first MUX includes a first switch coupled between a first input and a first output, a first pullup device coupled between VDD and the first output, and a first pulldown device coupled between the first output and VSS. A digital to analog converter (DAC) is coupled the MUX. A controller configured to control a rising slope of the first output by, in a first phase, which is before the rising slope of the first output, turning ON the first switch, and turning OFF the first pulldown device. In a second phase, which is during the rising slope of the first output, the first input is coupled to an output of the DAC. In a third phase, which is after the rising slope of the first output, the first switch is turned OFF and the first pulldown device is turned ON.

In one embodiment, the controller is configured to control a falling slope of the first output by in a first phase, which is before the falling slope of the first output, turning ON the first switch, and turning OFF the first pullup device. In a second phase, which is during the falling slope of the first output, the first input is coupled to an output of the DAC. In a third phase, which is after the falling slope of the first output, the first switch is turned OFF and the first pulldown device is turned ON.

In one embodiment, there is a second MUX coupled to the digitally controlled circuit. The second MUX includes a second switch coupled between a second input and a second output, a second pullup device coupled between VDD and the second output, and a second pulldown device coupled between the second output and VSS. The controller is configured to control a falling slope of the second output by in a first phase, which is before the falling slope of the second output, turning ON the second switch, and turning OFF the second pullup device. In a second phase, which is during the falling slope of the second output, the second input is coupled to an output of the DAC. In a third phase, which is after the falling slope of the second output, the second switch is turned OFF and the second pulldown device is turned ON.

According to an embodiment of the present disclosure, a method of controlling a capacitance of a digitally controlled circuit coupled to a first multiplexer (MUX) having a first switch coupled between a first input and a first output, a first pullup device coupled between VDD and the first output, and a first pulldown device coupled between the first output and VSS, is provided. The method includes, controlling a falling slope of the first output by, in a first phase, which is before the falling slope of the first output, turning ON the first switch, and turning OFF the first pullup device; in a second phase, which is during the falling slope of the first output, coupling the first input to an output of a digital to analog converter coupled to the MUX; and in a third phase, which is after the falling slope of the first output, turning OFF the first switch and turning ON the first pulldown device.

In one embodiment, a rising slope of the first output is controlled by in a first phase, which is before the rising slope of the first output, turning ON the first switch, and turning OFF the first pulldown device; in a second phase, which is during the rising slope of the first output, coupling the first input to an output of the DAC; and in a third phase, which is after the rising slope of the first output, turning OFF the first switch and turning ON the first pulldown device.

In one embodiment the first output is coupled to one or more gate nodes of the digitally controlled circuit to control the variable capacitance of the digitally controlled circuit.

In one embodiment, the first switch, the first pullup device, and the first pulldown device are controlled independently.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 5A and 5B illustrate example waveforms and corresponding multiplexer settings associated with a filter preceding a multiplexer.

FIGS. 8A and 8B provide a graphical and hardware explanation of a control of a rising slope of an output signal of an analog multiplexer, consistent with an illustrative embodiment.

FIG. 8C illustrates an analog multiplexer that includes an additional multiplexer layer with respect to FIG. 8B, consistent with an illustrative embodiment.

DETAILED DESCRIPTION

Overview

Figure 1:
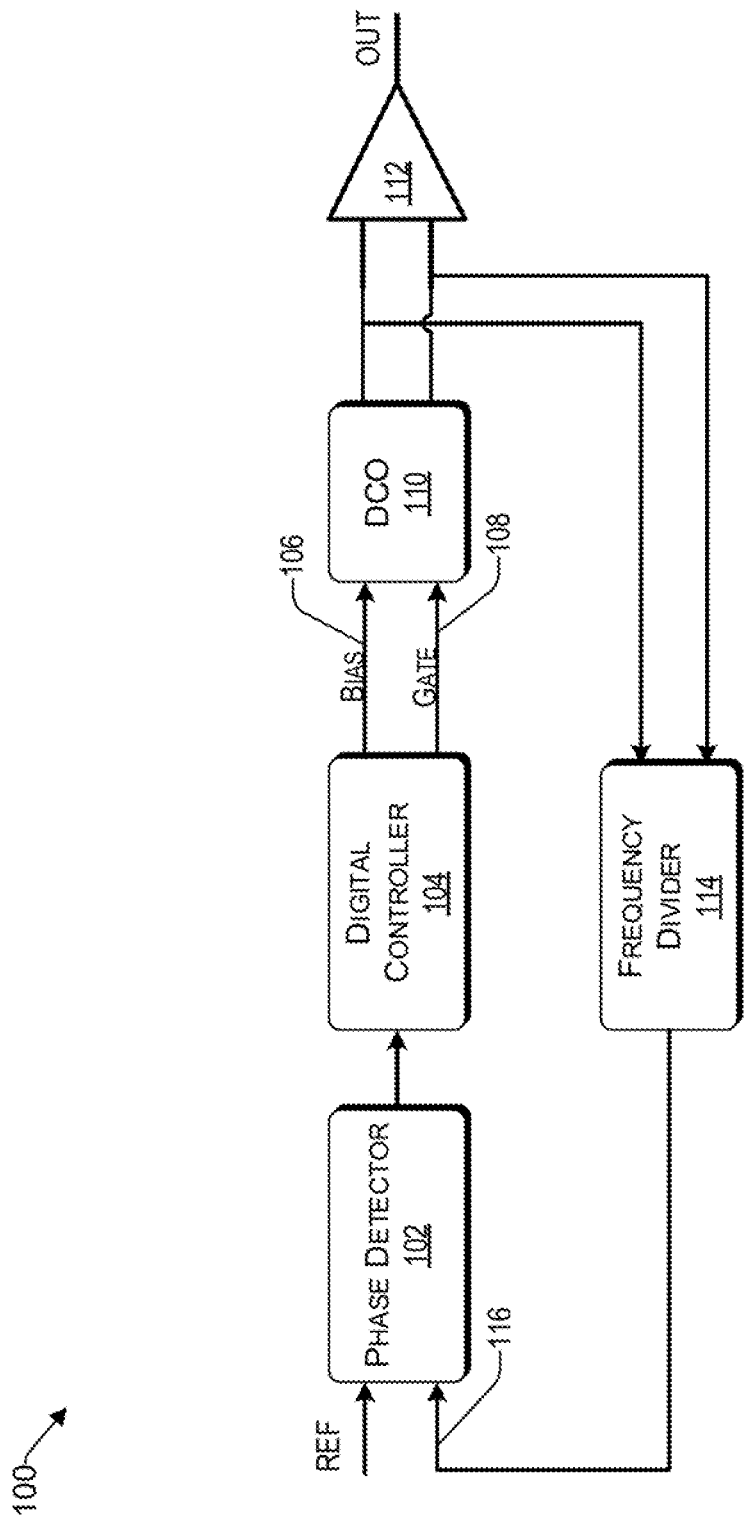
FIG. 1 is a block diagram of a digital phase locked loop that uses a digitally controlled oscillator, consistent with an illustrative embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Illustrative embodiments of the present disclosure are described herein in the context of oscillators used in circuits such as phase locked loops (PLLs). However, it is to be understood that principles of the present disclosure are not limited solely to the specific architectures described herein. For example, the techniques can be used in a number of other types of circuits including microprocessors, mm-wave radios, serial links, etc.

The present disclosure generally relates to systems and methods of controlling oscillator frequency. By virtue of the concepts discussed herein, the chip real estate associated with filtering output signals is reduced, while providing a more linear control of the frequency of an oscillator. More particularly, various embodiments provide for controlling the magnitude of a capacitance of a digitally controlled circuit using a "folding" structure. While the folding structure is described below primarily in the context of oscillators and PLLs, embodiments are not so limited. By way of example, the folding control structures described herein may be used in a wide variety of other types of digitally controlled circuits, including by way of example, filters.

Digital PLLs having low noise and a wide tuning range are desired for various applications. The digital control mechanism of an oscillator in a digital PLL can be a barrier towards building a digital PLL having low noise and a wide tuning range.

A high performance, low noise integrated oscillator includes an inductor, a capacitor and a negative resistance element for maintaining oscillation, along with a variable capacitor for controlling the frequency of the oscillator. DCO architectures may include a DAC used together with a varactor, sometimes referred to herein as a to form the DCO. DCO architectures may also use banks of digitally switched varactors, where each varactor is tied to a supply. Typically, existing DCO architectures have practical limitations that may prevent the implementation of wide tuning range, high frequency, and low noise oscillators.

An ideal DCO structure has a number of desired properties. One such desired property is that a small number of low gain varactors (e.g., two) should be active at a given time without limiting the total tuning range of the DCO. A large bank of low gain varactors can be used for a tuning range, provided that at any given time most of the varactors are saturated high or low. Another desired property is that the DCO architecture should use low resolution DACs, such as DACs at or below an 8-bit level. Higher resolution DACs may be used, but power and area may be compromised when using higher resolution DACs. Regarding the varactors in the DCO architecture, in one aspect, there should be no matching requirements between varactors and no simultaneous switching of capacitors that are required to match. There should also be no large signal switching of varactor control voltages. The DCO structure should also have an overall digital-to-frequency gain that is reasonably linear, even if the varactors used in the DCO architecture have low gain regions at the edge of their respective ranges. In various embodiments, some or all properties can be accommodated individually and/or simultaneously by the DCO architectures discussed herein.

Example Architecture

Reference now is made to FIG. 1, which is a block diagram of a digital phase locked loop (PLL) 100 that uses a DCO, consistent with an illustrative embodiment. The digital PLL 100 includes a phase detector 102, digital controller 104, DCO 110, driver 112, and frequency divider 114. The phase detector 102 is configured to detect a phase difference between a reference signal (REF) and the output 116 of the frequency divider 114. The frequency divider 114 is configured to divide the output frequency of the DCO 110 to provide frequency scaling. The output of the phase detector 102 is an input to the digital controller 104, which is configured to control the DCO 106 so as to match the divided output of the DCO 110 with the reference signal REF. To that end, the digital controller 104 controls the timing for bias 106 and gate control 108 of the DCO, which is explained in more detail later.

Figure 2B:
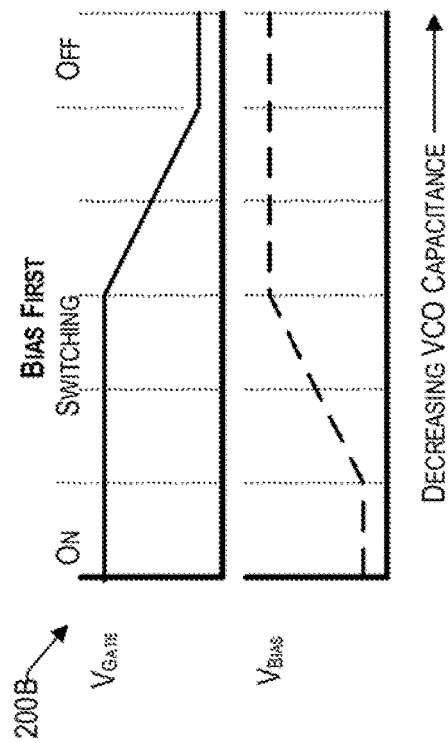
FIG. 2B is a graph of decreasing a voltage-controlled oscillator capacitance by controlling a bias node voltage before a gate bias voltage, consistent with an illustrative embodiment.
Figure 2C:
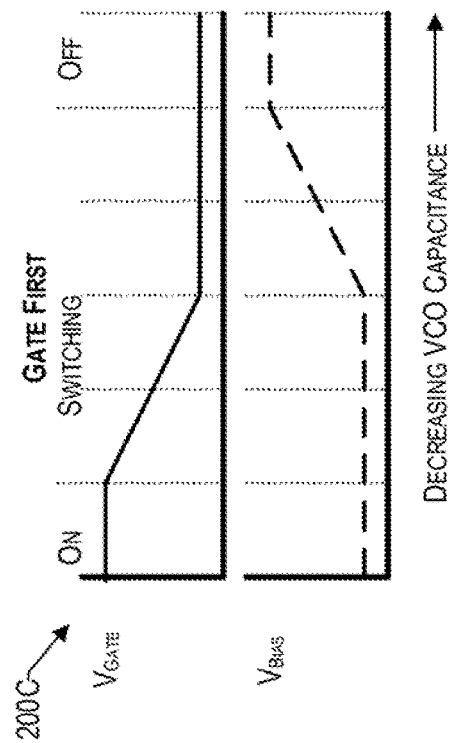
FIG. 2C is a graph of decreasing a voltage controlled-oscillator capacitance by controlling a gate voltage before a bias node voltage, consistent with an illustrative embodiment.
Figure 2A:
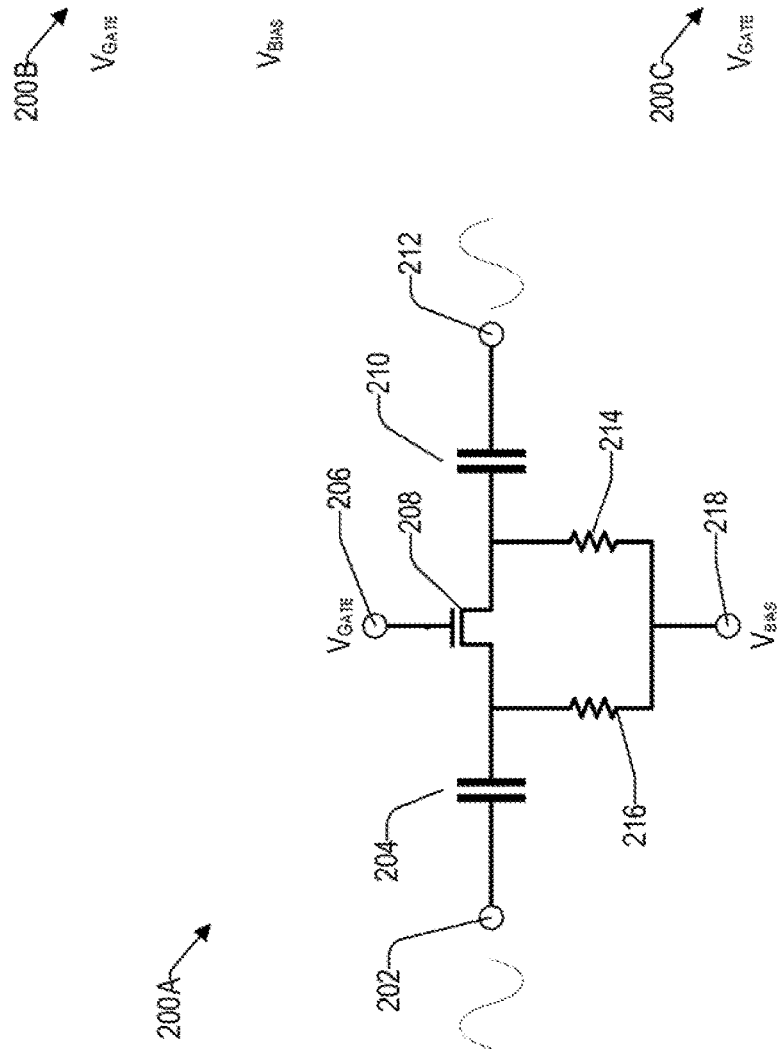
FIG. 2A is an example high-Q switched capacitor circuit, consistent with an illustrative embodiment.

FIG. 2A is an example high-Q switched capacitor circuit 200A, consistent with an illustrative embodiment. The high-Q switched capacitor circuit 200A includes a pair of capacitors 204 and 210 between a switch 208. In one embodiment, the switch 208 is a field effect transistor (FET), such as an n-channel metal oxide semiconductor (NMOS). Each end of the switch 208 (e.g., drain and source) is coupled to a corresponding resistor 214 and 216. The resistors 214 and 216 have a common connection to $V_{BIAS}$ 218. When the switch 208 is ON the impedance between nodes 202 and 212 is effectively the two capacitors 204 and 210 in series. When the switch 206 is OFF (i.e., the switch 208 behaves like an open circuit), the impedance looking into node 202 is essentially the capacitor 204 in series with the resistor 216. The impedance looking into node 212 behaves similarly. The capacitance of the switched capacitor circuit 200A can be changed incrementally by gradually changing the gate node 206 and/or the bias node 218 voltages.

The outputs 202 and 212 can provide a differential sinusoidal output, wherein its frequency can be varied by controlling the $V_{GATE}$ 206 and $V_{BIAS}$ 218 nodes, as illustrated by FIGS. 2B and 2C. More particularly, FIGS. 2B and 2C provide graphs of decreasing VCO capacitance, thereby increasing the oscillation frequency via bias first and gate first control, respectively. Stated differently, by virtue of changing the bias of the switched capacitor circuit 200A, the frequency of a voltage-controlled oscillator coupled to the output nodes 202 and 212 can be adjusted to a desired frequency.

For example, at high frequency (e.g., frequencies over 10 GHz), phase noise performance may be limited by the Q of the capacitors. Fixed metal-to-metal capacitors with a series switch give better phase noise as compared with an analog varactor. When $V_{GATE}$ 206 is HIGH, the switch 208 is ON, thereby connecting capacitors 204 and 210 to one another. Ideally, when switch 208 is ON, ideally there should be zero ON resistance $R_{on}$. When switch 208 is OFF there should be zero OFF parasitic capacitance $C_{off}$. However, in practice, the switch 208 has some non-zero on resistance $R_{on}$ and some non-zero parasitic capacitance $C_{off}$. The resistance of the switch may be reduced by increasing the size of the switch, but this comes at the cost of greater OFF-state parasitic capacitance.

A switch 208, such as the NMOS transistor of high-Q switched capacitor circuit 200A, can be gradually transitioned between its ON and OFF state to provide continuous tuning by controlling the $V_{GATE}$ 206 and $V_{BIAS}$ 218 nodes, as illustrated in FIGS. 2B and 2C. However, when the control signals $V_{GATE}$ 206 and $V_{BIAS}$ 218 for the switch 208 are between their extremes, the series loss of the switch 208 may degrade the Q of the switched capacitor circuit 200A, resulting in a degradation of phase noise. In this regard, folding techniques allow for a more seamless switching between bands, so the capacitance can be broken down into a large number of small switched capacitor circuits. As long as the size of the switched capacitor circuit that is transitioning between its ON and OFF states is a small fraction of the total capacitance, then the entire structure will have high Q even if one of the switched capacitor circuits is in a low Q state. An example folding technique using an array of switched capacitor circuits 2A is discussed below.

Example Switched Capacitor Structure

Figures 3A, 3B:
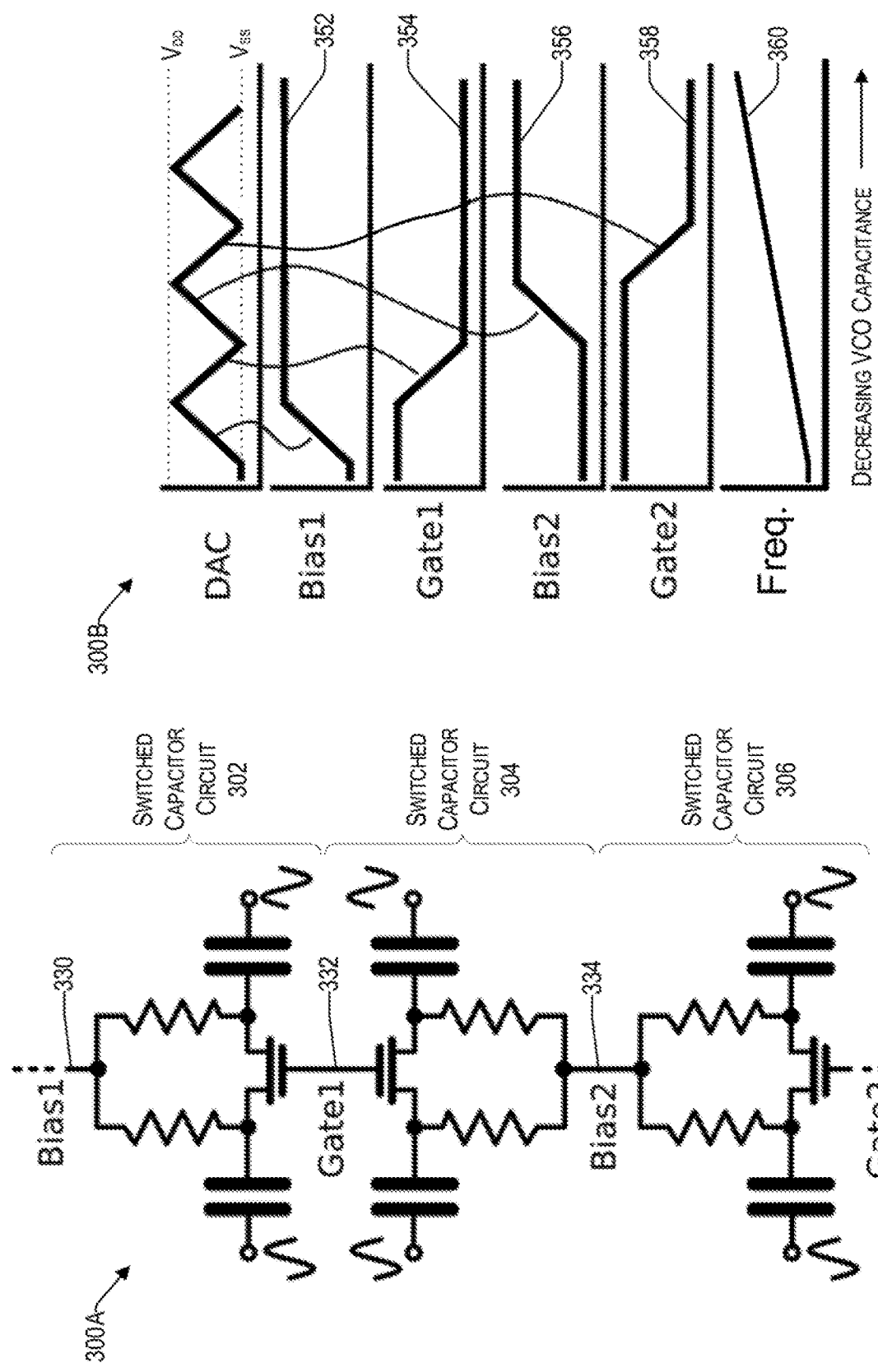
FIG. 3A is a folding switched capacitor structure, consistent with an illustrative embodiment.
FIG. 3B shows waveforms for decreasing a voltage-controlled oscillator capacitance in the folding capacitor structure of FIG. 3A, consistent with an illustrative embodiment.

FIG. 3A is a folding switched capacitor structure 300A, consistent with an illustrative embodiment. By way of example only and not by way of limitation, FIG. 3A shows three switched capacitor circuits 302, 304, and 306 coupled to each other, while it will be understood that any number of switched capacitor circuits can be added thereto. The folding switched capacitor structure 300A may be part of an oscillator, similar to that of the DCO 110 of FIG. 1.

In the example of FIG. 3A, each switched capacitor circuit is substantially similar to that of FIG. 2B and will therefore not be discussed here for brevity. Each switched capacitor circuit has a bias node and a gate node. Switched capacitor circuit 302 and 304 share the gate 1 node (332). Switched capacitor circuits 304 and 306 share the bias 2 node (334). The bias 1 (330) node of switched capacitor circuit 302 and the gate 2 node (336) of switched capacitor 306 are not shared with other switched capacitor circuits in the example of FIG. 3A. Accordingly, the folding switched capacitor structure 300A is controlled by bias 1 (330) gate 1 (332) bias 2 (334) and gate 2 (336) signals, which are provided by a digital controller, similar to the digital controller 104 of FIG. 1. The overall capacitance of the folding switched capacitor structure 300A is split into small capacitor units, controlled by switches, wherein the gates are shared between alternating switched capacitor circuits. Similarly, the bias nodes are shared between alternating switched capacitor circuits.

Although FIG. 3A shows the switched capacitor circuits 302, 304, and 306 to be physically located next to one another, such placement is not a requirement. Rather, the more salient consideration is the control of the bias and gate nodes, as described below.

FIG. 3B shows waveforms 300B for decreasing VCO capacitance in the folding capacitor structure 300A of FIG. 3A, consistent with an illustrative embodiment. A DAC control voltage, which may be from a sigma delta (ΣΔ) modulator, ramps up and down between VDD and $V_{SS}$. In the example of FIG. 3B, the bias 1 node (330 in FIG. 3A) is supplied with the DAC control voltage. To decrease the switched capacitor circuit 302 capacitance (and hence increase the VCO frequency), the voltage of the bias 1 node 330 gradually ramps up to $V_{DD}$ until the switched capacitor circuit 302 is saturated in its high impedance state, as illustrated in waveform 352. The bias 1 node 330 is then maintained at HIGH (e.g., $V_{DD}$).

To decrease the VCO capacitance further (thereby increasing the VCO frequency), the voltage at gate 1 node 332 is gradually transitioned from HIGH to LOW (e.g., $V_{DD}$ to $V_{SS}$). To that end, gate 1 node 332 is coupled to the falling slope of the DAC, as illustrated in waveform 354. In this way, the capacitance of the switched capacitor circuit 304 is decreased. Upon reaching the LOW level (e.g., $V_{SS}$), the voltage at the gate 1 node 332 is maintained at LOW (e.g., $V_{SS}$). In turn, the voltage of the bias 2 node 334 is gradually ramped up to $V_{DD}$ with the next rising slope to $V_{DD}$ and then maintained at $V_{DD}$, as illustrated by waveform 356.

To decrease the VCO capacitance further, the capacitance of the switched capacitor circuit 306 is reduced by ramping down the voltage at gate 2 node 336 with the next falling slope of the DAC, from $V_{DD}$ to $V_{SS}$, as illustrated in waveform 358.

While FIGS. 3A and 3B illustrate the switching of three switched capacitor circuits, it will be understood that any number of switched capacitor circuits can be used based on the concepts discussed herein. Thus, the process of reducing capacitance (and increasing the VCO frequency) can continue with additional switched capacitor circuit(s) coupled to the folding switched capacitor structure 300A until the desired VCO frequency is reached. Further, although an NMOS only folding approach is illustrated in FIG. 3A, the NMOS can be replaced with PMOS folding switched capacitor structure and the polarity of the control signals 352 to 358 reversed.

Example Multiplexing Approaches

Figure 4C:
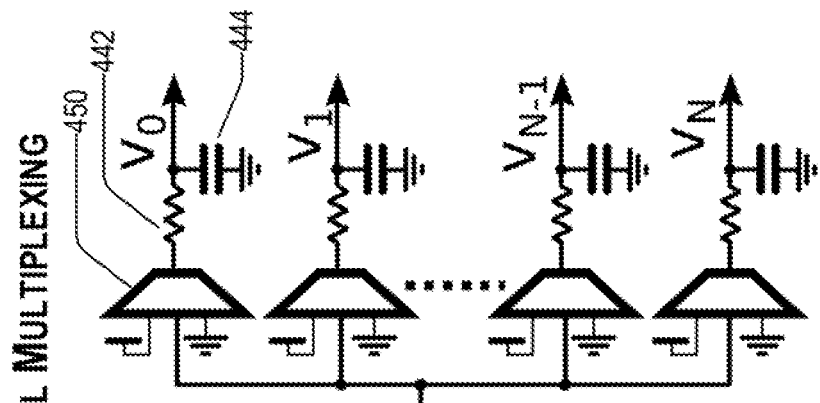
FIG. 4C shows a digital multiplexing structure, consistent with an illustrative embodiment.

As discussed above, the DAC control voltage, which can slope up and down between $V_{DD}$ and $V_{SS}$, can be applied to various bias and gate nodes of the folding switched capacitor structure 300A. To that end, different types of multiplexers can be used between a ΣΔ modulator providing the DAC signal and the relevant, gate and bias nodes. FIG. 4A, which shows an analog multiplexing structure 400A, consistent with an illustrative embodiment. The analog multiplexing structure 400A includes a one-bit ΣΔ modulator 410 providing the DAC signal. There is a filter, represented in FIG. 4A by a resistor 412 and a capacitor 414 between the one-bit ΣΔ modulator 410 and a plurality of analog multiplexers, sometimes referred to herein as a MUX bank. The combination of the ΣΔ modulator 410 and the filter provides a filtered DAC. In this regard, it is noted that the capacitor 414 of the filter typically consumes a substantial amount of the chip estate of the entire analog multiplexing structure 400A (e.g., in the order of magnitude of 50%).

Figure 4B:
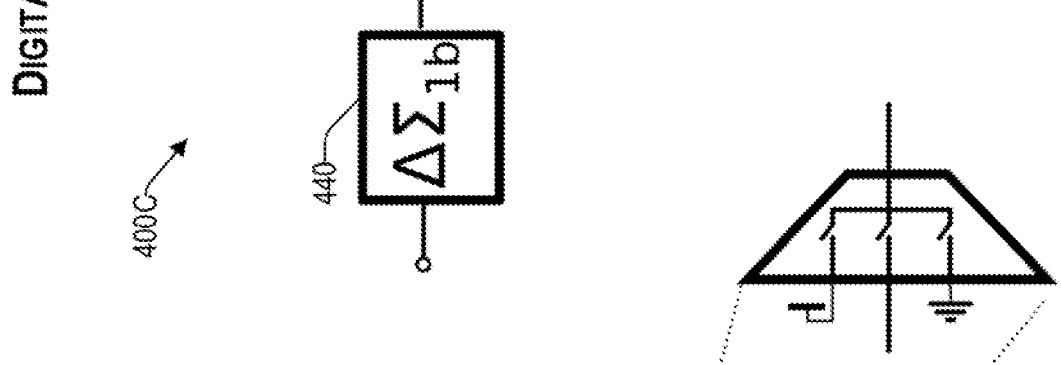
FIG. 4B shows additional detail of a multiplexer of FIG. 4A, consistent with an illustrative embodiment.
Figure 4A:
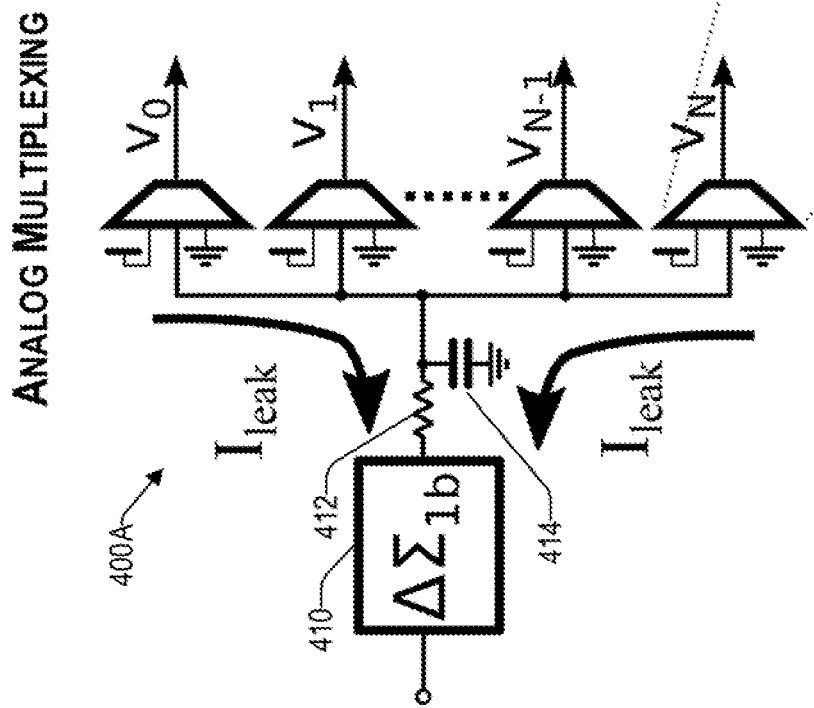
FIG. 4A shows an analog multiplexing structure, consistent with an illustrative embodiment.

Each of the multiplexers comprises a set of switches, as shown by way of example by FIG. 4B (without the mux select signals). A controller (not shown in FIG. 4A), determines whether to couple the output of the multiplexer to a positive supply voltage (e.g., $V_{DD}$), a negative supply voltage (e.g., $V_{SS}$ or ground) or to the DAC signal provided by the ΣΔ modulator 410. The analog multiplexing structure 400A is generally sensitive to leakage, thereby degrading its performance.

By way of contrast, FIG. 4C shows a digital multiplexing structure 400C, consistent with an illustrative embodiment. In the example digital multiplexing structure 400C the RC filters are not at the output of the ΣΔ modulator 440; rather, they are included at the output of each multiplexer, such as resistor 442 and capacitor 444 at the output of the first digital multiplexer 450, to take out the noise from the ΣΔ modulator 440. Accordingly, digital multiplexing may involve many RC filters, which may become impractical in terms of chip real estate, without the use of high-density capacitors.

Reference now is made to FIGS. 5A and 5B, which illustrate example waveforms and corresponding MUX settings associated with an RC filter preceding a MUX. For example, the output of the DAC, represented by node Vx, can be coupled by the MUX 540 to control the gate voltage of a switched capacitor circuit. Thus, the gate voltage is controlled by the DAC, as illustrated by portion 512 of FIG. 5A. Upon the DAC reaching $V_{DD}$, the MUX is switched (542) to provide $V_{DD}$ to the gate voltage, as illustrated by portion 514 of the waveform of FIG. 5A. Thus, ideally, there is a smooth transition (i.e., no glitch) from the slope of the DAC to $V_{DD}$ and maintenance of the $V_{DD}$ voltage level after the MUX is switched to $V_{DD}$ 514.

However, as discussed above, the size of the capacitor in the filter associated with the DAC and or the MUX is a salient consideration in the physical implementation thereof. To make the size of the capacitor more manageable, while maintaining a desired RC time constant, the capacitance (and therefore size) of the capacitor can be reduced, while the resistance of the resistor increased. Such approach does not come without side-effects. In this regard, FIG. 5B illustrates an example waveform 504 and corresponding MUX settings associated with an RC filter preceding a MUX having a leakage current. When the gate voltage is controlled by the DAC (section 522 of the waveform 504), node Vx is coupled by the MUX to the gate voltage (550), which is gradually ramped up (i.e., rising slope). However, due to the voltage drop across the resistor 556, node Vx and ultimately the gate voltage does not reach $V_{DD}$. However, when the MUX is switched to $V_{DD}$ (552), the gate voltage is coupled by the MUX directly to $V_{DD}$ (section 524 of the waveform 504), thereby introducing a glitch, represented in waveform 504 by a DAC error voltage 530.

For example, when the DAC output switches from one switched capacitor circuit to another, there may be a small glitch if the maximum or minimum voltage that the DAC produces is not identical to the voltage applied to the varactor when switched to $V_{DD}$ or $V_{SS}$, respectively. When a DCO is used in a PLL, if the PLL is trying to achieve lock at a frequency corresponding to a boundary between two switched capacitor circuits, this mismatch could result in the PLL switching back and forth between these switched capacitor circuits. This switching can cause small periodic glitches in the output frequency of the DCO, which degrades phase noise performance.

Figure 6:
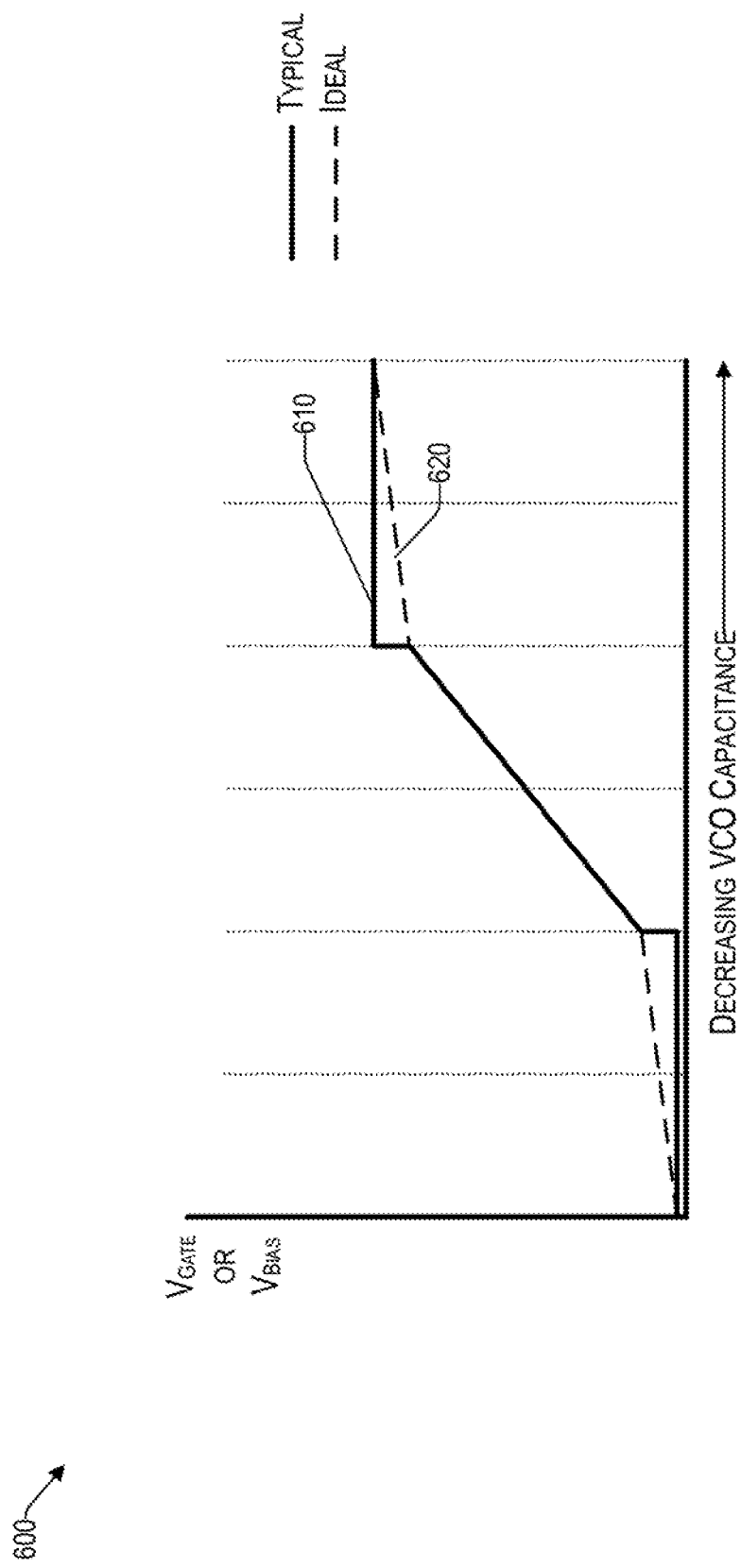
FIG. 6 is a graph of control voltage versus decreasing capacitance, consistent with an illustrative embodiment.

In one embodiment, the glitch is mitigated by, instead of switching abruptly from the DAC output voltage to $V_{DD}$ or $V_{SS}$, using a gradual and controlled transition, which is orchestrated by an appropriately configured controller. As used herein, the term gradual includes the meaning of using a rate of transition that does not result in a step function but a controlled linear change. Thus, for an arbitrarily small change in the control signal to a MUX, a step change of the bias or gate voltage is avoided. This concept is better understood in view of FIG. 6, which provides a graph 600 of control voltage versus decreasing capacitance, consistent with an illustrative embodiment. Ideally, as the VCO capacitance is decreased (and thus the VCO frequency increased), there should not be an abrupt change in the $V_{GATE}$ or $V_{BIAS}$ control voltage of a folding switched capacitor structure, as illustrated by curve 620 in FIG. 6. In contrast, in known approaches the $V_{GATE}$ or $V_{BIAS}$ is subject to abrupt changes in control voltage, which is caused by immediate switching between DAC control and $V_{DD}$ or $V_{SS}$, as illustrated by curve 610. By virtue of the concepts discussed herein the $V_{GATE}$ and $V_{BIAS}$ voltages are substantially smoothed out, thereby behaving more closely to the ideal curve 620. In this way, the more area efficient analog multiplexing structure can be used while mitigating its leakage concerns.

Figure 7A:
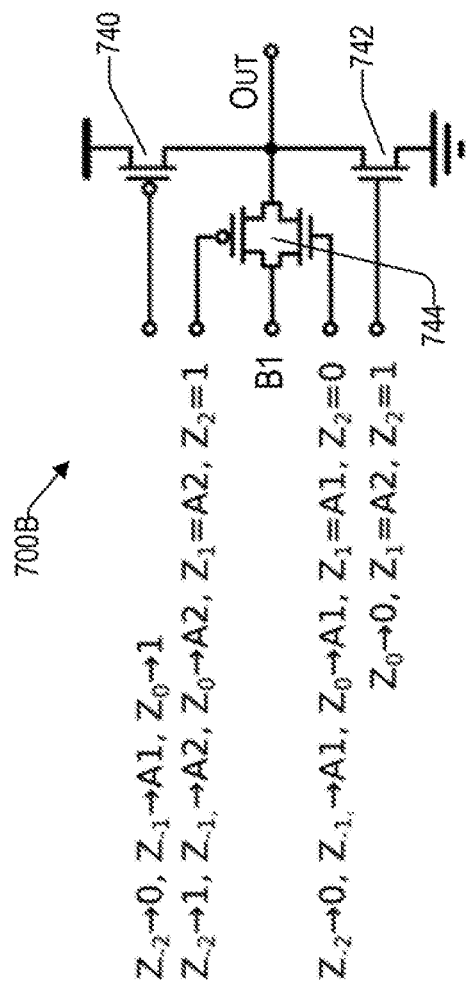
FIGS. 7A and 7B provide a graphical and hardware explanation of a control of a falling slope of an output signal of an analog multiplexer, consistent with illustrative embodiments.
Figure 7B:
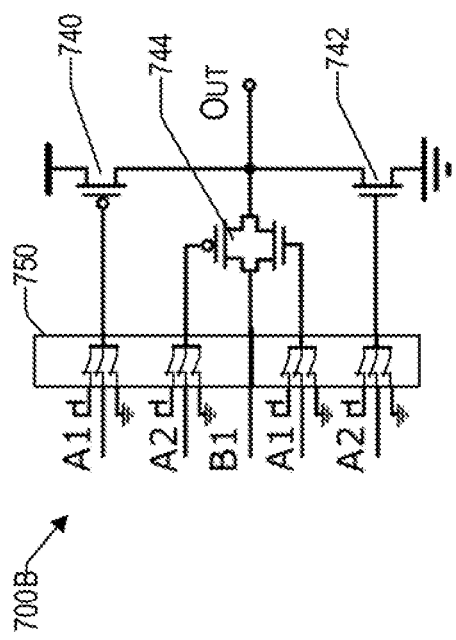

FIGS. 7A and 7B provide a graphical and hardware explanation of a control of a falling slope of an output signal of an analog mux, consistent with an illustrative embodiment. More particularly, FIG. 7B illustrates at least a portion of an analog mux 700B that may be used for gate control of a folding switched capacitor structure. The analog mux 700B includes a switch 744 coupled between an input B1 and a common output. In various embodiments, the switch may include one or more transistors, such as a PFET, NFET, or combination thereof to implement a transmission gate.

The analog mux 700B includes a PFET 740, sometimes referred to herein as the pullup device, having a first node (e.g., source) coupled to $V_{DD}$ and its second node (e.g., drain) coupled to the common output. The PFET 740 has a gate operative to control its ON/OFF state. The mux 700B includes an NFET 742, sometimes referred to herein as the pulldown device, having a first node (e.g., drain) coupled to the common output and a second node (e.g., source) coupled to $V_{SS}$ (e.g., GND). The NFET 742 has a gate that is operative to control its ON/OFF state. Both the PFET 740 and the NFET 742 receive signals from a controller, based on a sequence explained in the context of FIG. 7A and as discussed below.

The control of the sequence for the falling slope is split into separate phases. On a phase before the output transition (denoted as phase $Z_{-1}$ in waveforms 700A), the switch 744 is turned from OFF to ON. To that end, the PFET of the switch 744 is turned OFF and the NFET of the switch 744 is turned ON, as illustrated by waveform A2. During this phase, the pullup device 740 goes from ON to OFF, as illustrated by waveform A1 in FIG. 7A.

During phase $Z_0$, the common output transitions from HIGH to LOW. To that end, the input of the switch 744 is coupled to B1. In one embodiment, this phase is during the falling slope of the DAC associated with signal B1.

Phase $Z_1$ is after the output transition to LOW. For example, it is during the subsequent rising slope of the DAC. During phase $Z_1$, the switch 744 goes from ON to OFF. To that end, the PFET of the switch 744 is turned OFF and the NFET of the switch 744 is turned ON, as illustrated by waveform A2. During this phase, the pulldown device 740 goes from OFF to ON, as illustrated by waveform A2 in FIG. 7A. For example, this phase may be during a rising slope of the DAC associated with signal A1.

Figure 7C:
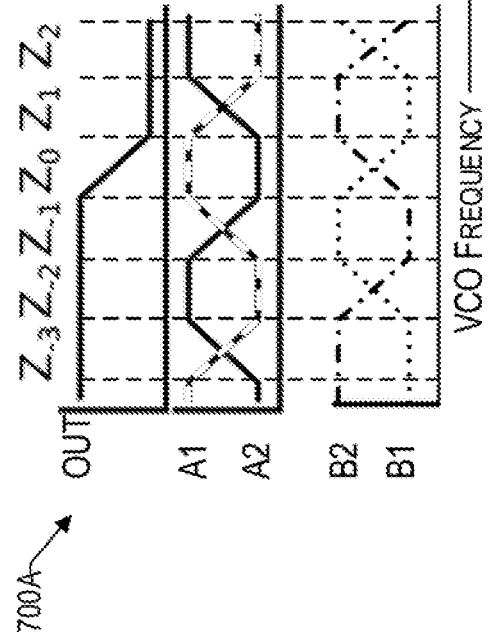
FIG. 7C illustrates an analog multiplexer that includes an additional multiplexer layer, consistent with an illustrative embodiment.

As discussed above, the control of the analog MUX 700B involves applying different signals during different phases of the operation of the MUX 700B. In this regard, FIG. 7C illustrates an analog MUX 700C that includes an additional MUX layer 750, consistent with an illustrative embodiment. For example, a digital controller controls each MUX in the additional MUX layer 750 according to the waveforms 700A and the timing discussed above.

FIGS. 8A and 8B provide a graphical and hardware explanation of a control of a rising slope of an output signal of an analog mux, consistent with an illustrative embodiment. More particularly, FIG. 7B illustrates at least a portion of an analog mux 800B that may be used for falling slope control of a folding switched capacitor structure. For example, such control may be used as bias control of a folding switched capacitor structure. FIG. 8C illustrates an analog MUX 800C that includes an additional MUX layer 850, consistent with an illustrative embodiment. FIGS. 8B and 8C are substantially similar to FIGS. 7B and 7C, respectively, and are therefore not repeated here for brevity.

The control of the sequence for the rising slope is split into separate phases. On a phase before the output transition (denoted as phase $Z_{-1}$ in waveforms 800A), the switch 844 is turned from OFF to ON. To that end, the PFET of the switch 844 is turned OFF and the NFET of the switch 844 is turned ON, as illustrated by waveforms A2 and A1, respectively. During this phase, the pulldown device 842 goes from ON to OFF, and the pullup device 840 goes from OFF to ON, as illustrated by waveform A2 in FIG. 8A. For example, this phase may be during a falling slope of the DAC associated with signal A1.

During phase $Z_0$, the common output transitions from LOW to HIGH. To that end, the input of the switch 844 is coupled to B2. In one embodiment, this phase is during the rising slope of the DAC associated with signal B2.

Phase $Z_1$ is after the output transition to HIGH. For example, it is during the subsequent falling slope of the DAC. During phase $Z_1$, the switch 844 goes from ON to OFF. To that end, the PFET of the switch 844 is turned OFF and the NFET of the switch 844 is turned ON, as illustrated by waveforms A2 and A1, respectively. During this phase, the pullup device 842 goes from OFF to ON, as illustrated by waveform A1 in FIG. 8A. For example, this phase may be during a falling slope of the DAC associated with signal A1.

Example Block Diagrams

Figure 9:
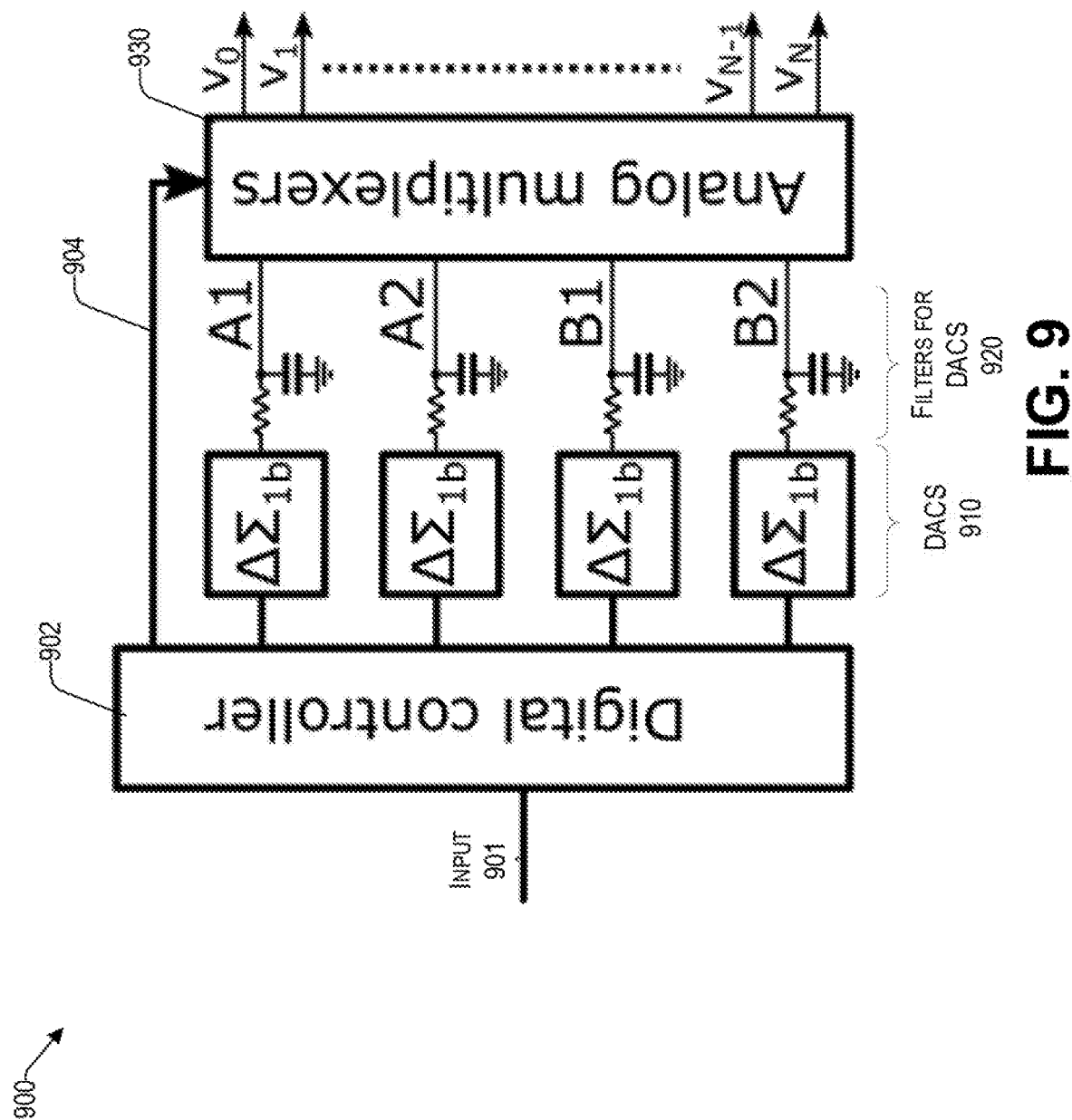
FIG. 9 illustrates example signals between a digital controller and an analog multiplexer bank, consistent with an exemplary embodiment.

FIG. 9 is a conceptual block diagram 900 of example signals between a digital controller and an analog MUX bank. The block diagram includes a digital controller 902 coupled to a MUX bank 930 and a plurality of DACS 910.

Each DAC in the plurality of DACS 910 has a corresponding filter (e.g., RC), as illustrated collectively by the filters 920. In the example of FIG. 9, there are four 1-bit ΣΔ modulators, each having a filter at its output. The filtered outputs provide control signals A1, A2, B1, and B2, which are substantially similar to those discussed in the context of FIGS. 7A and 7B. These signals A1 to B2 are part of the control signals of the MUX bank 930.

For example, the digital controller 902 provides direct multiplexer control signals 904 to each analog MUX in the MUX bank 930, thereby controlling whether an output of each analog MUX is switched to $V_{DD}$, $V_{SS}$, or the filtered output of a DAC (e.g., A1, A2, B1, or B2). By including the filters for the DACS 920 before the outputs of the analog multiplexers 930 the real estate occupied by the capacitors of the filters 920 is substantially reduced. Further, abrupt changes at the output of the analog multiplexers 930 is avoided by the digital controller 902 controlling the multiplexers 930 in a manner as discussed herein.

Figure 10:
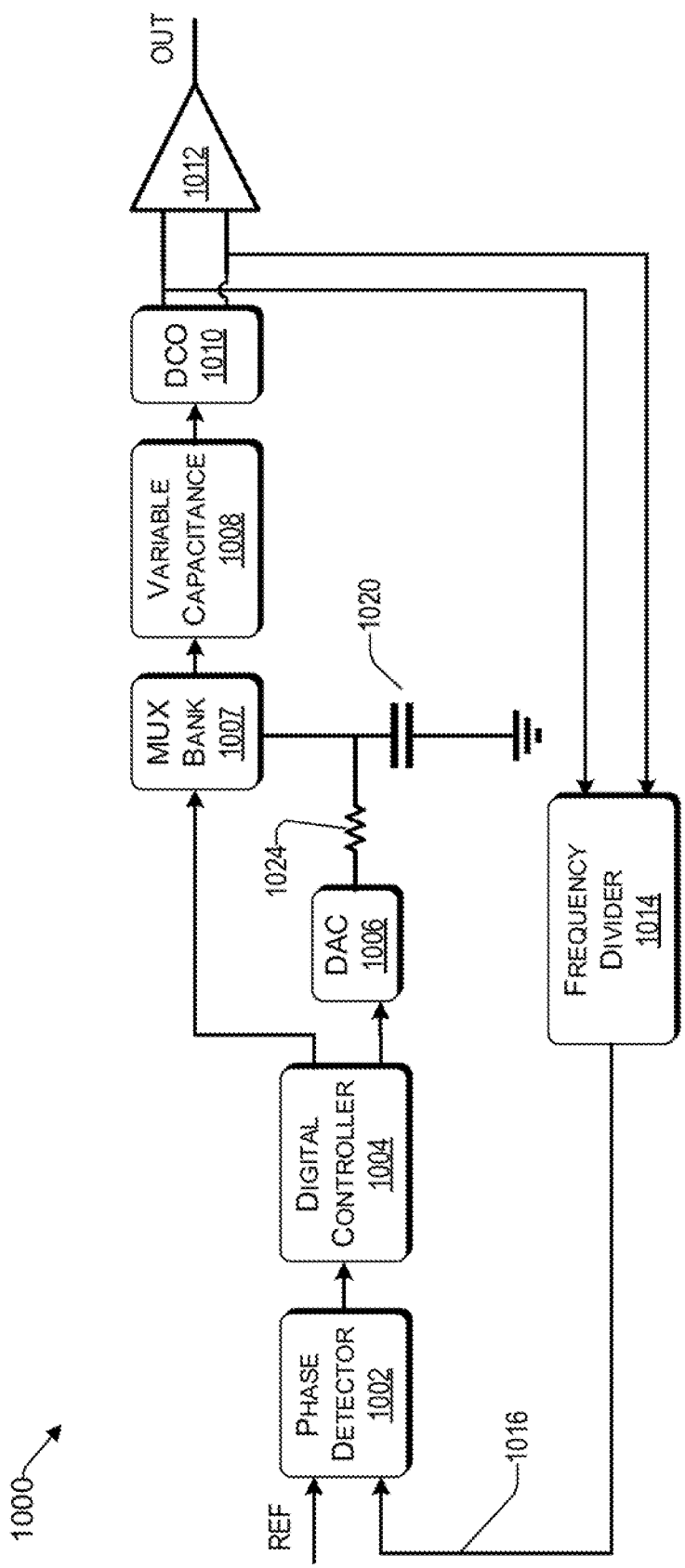
FIG. 10 is a conceptual block diagram of a digital phase locked loop that is configured to provide gradual transitions at the output of its multiplexer, consistent with an illustrative embodiment.

FIG. 10 is a conceptual block diagram of a digital PLL 1000 that is configured to provide gradual transitions at the output of its MUX, consistent with an illustrative embodiment. The digital PLL 1000 includes a phase detector 1002, digital controller 1004, a DAC 1006, a MUX bank 1007, a variable capacitance 1008, a DCO 1010, driver 1012, and frequency divider 1014. The phase detector 102 is configured to detect a phase difference between a reference signal (REF) and the output 1016 of the frequency divider 1014. The frequency divider 1014 is configured to divide the output frequency of the DCO 1010 to provide frequency scaling. The output of the phase detector 1002 is an input to the digital controller 1004, which is configured to control the DAC 1006 and the MUX bank 1007 such that the divided output of the DCO 1010 matches the reference signal REF. For example, the MUX bank 1007 may be similar to that described in the context of FIG. 4A. Stated differently, the MUX bank 1007 may be based on an analog multiplexing approach, thereby eliminating the need to have a filter at the output of every MUX within the bank 1007 (e.g., 128, 256, 512, etc.). Instead, the filtration (i.e., capacitor 1020 and resistor 1024) is provided between the DAC 1006 and the MUX bank 1007. While a single DAC 1006 and RC filter 1020, 1024 is illustrated in FIG. 10 for simplicity, it will be understood that several DACS can be used, each having its corresponding output RC filter, similar to the structure discussed in the context of FIG. 9.

By virtue of reducing the number (i.e., size) of the capacitors used, substantial real estate can be saved. Such improvement is facilitated by the digital controller 1004 being able to control the MUX bank 1007 such that the rising slope and falling slope transitions of the MUX bank 1007 are gradual, based on the concepts discussed herein. In this way, there is no abrupt change in the variable capacitance 1008 and a more linear control of the DCO 1010 is provided.

Example Process

Figure 11:
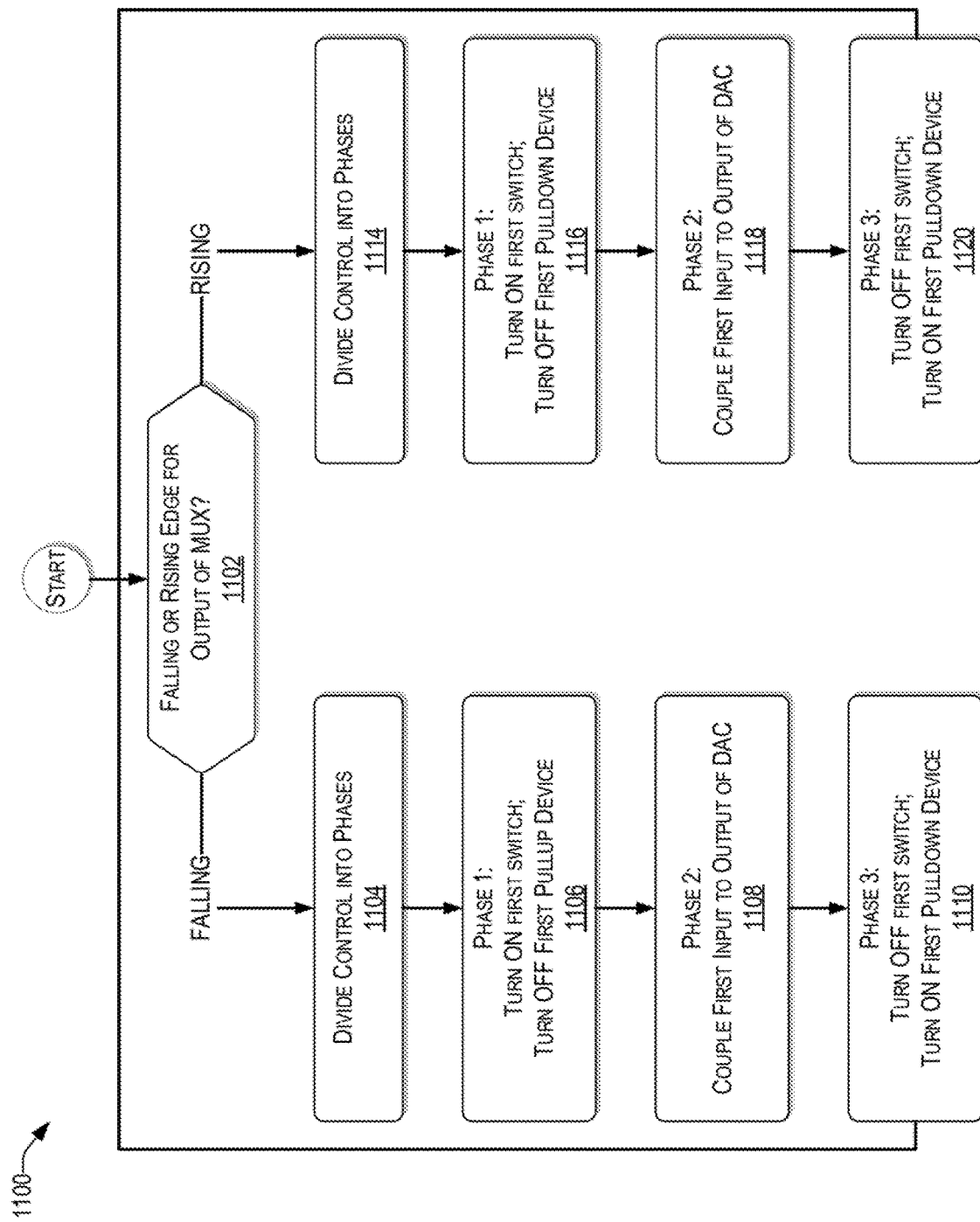
FIG. 11 presents a process for controlling a capacitance of a variable capacitance circuit, consistent with an illustrative embodiment.

With the foregoing overview of a digital PLL 110, folding switched capacitor structure 300A, multiplexing approaches 400A/B, control of different edges of MUXES 7B and 8B, and a conceptual block diagram of a PLL 1000 using the concepts discussed herein, it may be helpful now to consider a high-level discussion of an example process. To that end, FIG. 11 presents a process 1100 for controlling a capacitance of a variable capacitance circuit, consistent with an illustrative embodiment. Process 1100 is illustrated as a collection of processes in a logical flowchart, wherein each block represents a sequence of operations that can be implemented in hardware, software, or a combination thereof. In the context of software, the processes represent computer-executable instructions that, when executed by one or more processors, perform the recited operations. Generally, computer-executable instructions may include routines, programs, objects, components, data structures, and the like that perform functions or implement abstract data types. The order in which the operations are described is not intended to be construed as a limitation, and any number of the described processes can be combined in any order and/or performed in parallel to implement the process. For discussion purposes, the process 1100 is described with reference to FIGS. 7C, 8C, and 10.

By way of example, consider a MUX bank 1007 comprising a plurality of MUXES, which is controlled by a digital controller 1004. A first MUX of the MUX bank 907 is coupled to digitally controlled circuit having a variable capacitance 908. For example, the variable capacitance may be folding switched capacitor structure, similar to that of FIG. 3A. Each MUX may include components similar to those depicted in FIGS. 7C and 8C.

At block 1102, the controller determines whether a rising slope or a falling slope is to be controlled. For example, a falling slope may be associated with adjusting a voltage of a gate or gate pair (e.g., 332) of a folding switched capacitor structure 300A. Upon determining that a falling slope is to be controlled (i.e., "FALLING" in decision block 1102), the process continues with block 1104, where the controller divides the control into a plurality of phases.

At block 1106, the controller enters a first phase of a first MUX, which is before the falling slope of the first output. The first switch 744 is turned ON and the first pullup device 740 is turned OFF.

At block 1108, the controller enters a second phase, which is during the falling slope of the first output. During this phase, the first input is coupled to an output of the DAC 906.

At block 1110, the controller enters a third phase, which is after the falling slope of the first output. During this phase, the first switch 744 is turned OFF and the first pulldown device 724 is turned ON.

Returning to block 1102, upon determining that a rising slope is to be controlled (i.e., "RISING" in decision block 1102), the process continues with block 1114, where the controller divides the control into a plurality of phases.

At block 1116, the controller enters a first phase of the first or another MUX, referred to herein for simplicity as the first MUX, while it will be understood that another MUX in the MUX bank 907 can be controlled. The first phase is before the rising slope of the first output. The first switch 744 is turned ON and the first pulldown device 740 is turned OFF.

At block 1118, the controller enters a second phase, which is during the rising slope of the first output. During this phase, the first input is coupled to an output of the DAC 906.

At block 1120, the controller enters a third phase, which is after the rising slope of the first output. During this phase, the first switch 744 is turned OFF and the first pulldown device 724 is turned ON.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method.

While NFETS and PFETS are illustrated in some of the examples herein, these transistors were provided by way of example only, and not by way of limitation. It will be understood, based on the concepts disclosed herein, that other types of insulated-gate field effect transistors (IGFET) with complementary logic may be used as well. For example, any FETS from columns III-V of the periodic table, including carbon nanotube FETS could be used as well to implement the structures described herein. In some embodiments, bipolar transistors (e.g., PNP or NPN) can be used instead of MOS transistors.

Aspects of the present disclosure are described herein with reference to flowchart illustrations and/or block diagrams of methods, apparatus (systems), and computer program products according to embodiments of the application. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. An apparatus, comprising:
    a digitally controlled circuit having a variable capacitance;
    a first multiplexer (MUX) coupled to the digitally controlled circuit, the first MUX comprising:
        a first switch coupled between a first input and a first output;
        a first pullup device coupled between $V_{DD}$ and the first output; and
        a first pulldown device coupled between the first output and $V_{SS}$;
    a digital to analog converter (DAC) coupled the MUX; and
    a controller configured to control a falling slope of the first output by:
        in a first phase, which is before the falling slope of the first output, turning ON the first switch, and turning OFF the first pullup device;
        in a second phase, which is during the falling slope of the first output, coupling the first input to an output of the DAC; and
        in a third phase, which is after the falling slope of the first output, turning OFF the first switch and turning ON the first pulldown device.

2. The apparatus of claim 1, wherein the controller is configured to control a rising slope of the first output by:
    in a first phase, which is before the rising slope of the first output, turning ON the first switch, and turning OFF the first pulldown device;
    in a second phase, which is during the rising slope of the first output, coupling the first input to an output of the DAC; and
    in a third phase, which is after the rising slope of the first output, turning OFF the first switch and turning ON the first pulldown device.

3. The apparatus of claim 1, further comprising a second MUX coupled to the digitally controlled circuit, the second MUX comprising:
    a second switch coupled between a second input and a second output;
    a second pullup device coupled between $V_{DD}$ and the second output; and
    a second pulldown device coupled between the second output and $V_{SS}$, wherein the controller is configured to control a rising slope of the second output by:
        in a first phase, which is before the rising slope of the second output, turning ON the second switch, and turning OFF the second pulldown device;
        in a second phase, which is during the rising slope of the second output, coupling the second input to an output of the DAC; and
        in a third phase, which is after the rising slope of the second output, turning OFF the second switch and turning ON the second pullup device.

4. The apparatus of claim 3, wherein:
    the first output is coupled to one or more gate nodes of the digitally controlled circuit to control the variable capacitance of the digitally controlled circuit; and
    the second output is coupled to one or more bias nodes of the digitally controlled circuit to control the variable capacitance of the digitally controlled circuit.

5. The apparatus of claim 1, wherein the controller is configured to control the first switch, the first pullup device, and the first pulldown device independently.

6. The apparatus of claim 1, wherein:
    the pullup device is a PFET; and
    the pulldown device is an NFET.

7. The apparatus of claim 1, wherein the digitally controlled circuit is a folding switched capacitor circuit.

8. The apparatus of claim 1, wherein the multiplexer is an analog multiplexer.

9. The apparatus of claim 8, wherein there is an RC filter between the DAC and the analog multiplexer.

10. The apparatus of claim 1, wherein the digitally controlled circuit comprises a plurality of switched capacitor circuits, each switched capacitor comprising:
    a transistor having a gate node, a first node, and a second node;
    a first capacitor coupled to the first node of the transistor;
    a second capacitor coupled to the second node of the transistor;
    a first resistor coupled between the first node of the transistor and a bias node; and
    a second resistor coupled between the second node of the transistor and the bias node.

11. The apparatus of claim 10, wherein gate nodes of alternating pairs of switched capacitor circuits of the plurality of switched capacitor circuits are connected together.

12. The apparatus of claim 10, wherein bias nodes of alternating pairs of switched capacitor circuits of the plurality of switched capacitor circuits are connected together.

13. A method of controlling a capacitance of a digitally controlled circuit coupled to a first multiplexer (MUX) having a first switch coupled between a first input and a first output, a first pullup device coupled between $V_{DD}$ and the first output, and a first pulldown device coupled between the first output and $V_{SS}$, the method comprising, controlling a falling slope of the first output by:
    in a first phase, which is before the falling slope of the first output, turning ON the first switch, and turning OFF the first pullup device;
    in a second phase, which is during the falling slope of the first output, coupling the first input to an output of a digital to analog converter coupled to the MUX; and
    in a third phase, which is after the falling slope of the first output, turning OFF the first switch and turning ON the first pulldown device.

14. The method of claim 13, further comprising controlling a rising slope of the first output by:
    in a first phase, which is before the rising slope of the first output, turning ON the first switch, and turning OFF the first pulldown device;
    in a second phase, which is during the rising slope of the first output, coupling the first input to an output of the DAC; and in a third phase, which is after the rising slope of the first output, turning OFF the first switch and turning ON the first pulldown device.

15. The method of claim 13, further comprising coupling the first output to one or more gate nodes of the digitally controlled circuit to control the variable capacitance of the digitally controlled circuit.

16. The method of claim 13, wherein the first switch, the first pullup device, and the first pulldown device are controlled independently.

17. The method of claim 13, further comprising filtering the output of the DAC.

18. An integrated circuit, comprising:
   a digitally controlled circuit having a variable capacitance;
   a first multiplexer (MUX) coupled to the digitally controlled circuit, the first MUX comprising:
      a first switch coupled between a first input and a first output;
      a first pullup device coupled between $V_{DD}$ and the first output; and
      a first pulldown device coupled between the first output and $V_{SS}$;
   a digital to analog converter (DAC) coupled the MUX; and
   a controller configured to control a rising slope of the first output by:
      in a first phase, which is before the rising slope of the first output, turning ON the first switch, and turning OFF the first pulldown device;
      in a second phase, which is during the rising slope of the first output, coupling the first input to an output of the DAC; and
      in a third phase, which is after the rising slope of the first output, turning OFF the first switch and turning ON the first pulldown device.

19. The integrated circuit of claim 18, wherein the controller is configured to control a falling slope of the first output by:
   in a first phase, which is before the falling slope of the first output, turning ON the first switch, and turning OFF the first pullup device;
   in a second phase, which is during the falling slope of the first output, coupling the first input to an output of the DAC; and
   in a third phase, which is after the falling slope of the first output, turning OFF the first switch and turning ON the first pulldown device.

20. The integrated circuit of claim 18, further comprising a second MUX coupled to the digitally controlled circuit, the second MUX comprising:
   a second switch coupled between a second input and a second output;
   a second pullup device coupled between $V_{DD}$ and the second output; and
   a second pulldown device coupled between the second output and $V_{SS}$, wherein the controller is configured to control a falling slope of the second output by:
   in a first phase, which is before the falling slope of the second output, turning ON the second switch, and turning OFF the second pullup device;
   in a second phase, which is during the falling slope of the second output, coupling the second input to an output of the DAC; and
   in a third phase, which is after the falling slope of the second output, turning OFF the second switch and turning ON the second pulldown device.

* * * * *